(12) United States Patent
Ikeda

(10) Patent No.: US 10,269,775 B2
(45) Date of Patent: Apr. 23, 2019

(54) SEMICONDUCTOR DEVICE AND METHOD FOR MANUFACTURING SEMICONDUCTOR DEVICE

(71) Applicant: SHINDENGEN ELECTRIC MANUFACTURING CO., LTD., Tokyo (JP)

(72) Inventor: Kosuke Ikeda, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 82 days.

(21) Appl. No.: 15/325,391

(22) PCT Filed: Feb. 3, 2016

(86) PCT No.: PCT/JP2016/053252
§ 371 (c)(1),
(2) Date: Jan. 10, 2017

(87) PCT Pub. No.: WO2017/134776
PCT Pub. Date: Aug. 10, 2017

(65) Prior Publication Data
US 2018/0219004 A1    Aug. 2, 2018

(51) Int. Cl.
H01L 25/07 (2006.01)
H01L 25/18 (2006.01)
H01L 23/498 (2006.01)
H01L 23/00 (2006.01)

(52) U.S. Cl.
CPC ...... *H01L 25/072* (2013.01); *H01L 23/49833* (2013.01); *H01L 25/18* (2013.01); *H01L 24/32* (2013.01); *H01L 24/83* (2013.01); *H01L 2224/01* (2013.01); *H01L 2224/32225* (2013.01); *H01L 2224/83815* (2013.01); *H01L 2924/11* (2013.01)

(58) Field of Classification Search
CPC ... H01L 25/072; H01L 25/18; H01L 2224/01; H01L 2924/11
See application file for complete search history.

(56) References Cited

U.S. PATENT DOCUMENTS

| | | | |
|---|---|---|---|
| 2011/0081750 A1 | 4/2011 | Machida | |
| 2013/0105956 A1* | 5/2013 | Jo | H01L 23/4334 257/676 |
| 2014/0264435 A1 | 9/2014 | Iguchi et al. | |

FOREIGN PATENT DOCUMENTS

| | | |
|---|---|---|
| CN | 104051445 A | 9/2014 |
| JP | 2006-086438 A | 3/2006 |
| JP | 2009-224550 A | 10/2009 |

(Continued)

OTHER PUBLICATIONS

U.S. Appl. No. 15/325,383, Ikeda Kosuke, filed Jan. 10, 2017.

(Continued)

*Primary Examiner* — Syed I Gheyas
(74) *Attorney, Agent, or Firm* — Ladas & Parry, LLP

(57) ABSTRACT

A semiconductor device has a first board (10); and an intermediate layer (20) being provided on the first board (10) and having a plurality of connectors (31), (41). The first board (10) has a positioning section (5) that positions the intermediate layer (20). The intermediate layer (10) is provided with a positioning insertion section (37), (47), into which the positioning section (5) is inserted.

7 Claims, 14 Drawing Sheets

(56) References Cited

FOREIGN PATENT DOCUMENTS

| | | |
|---|---|---|
| JP | 2011-082323 A | 4/2011 |
| JP | 2011-114176 A | 6/2011 |
| JP | 2014-078658 A | 5/2014 |
| JP | 2014-165486 A | 9/2014 |
| JP | 2014-179547 A | 9/2014 |
| JP | 2015-029157 A | 2/2015 |

OTHER PUBLICATIONS

International Search Report for PCT/JP2016/053252 dated Apr. 19, 2016 and its English machine translation from Bing Translator.
International Preliminary Examination Report Chapter 2 for PCT/JP2016/053252 dated Jun. 23, 2016 and its English machine translation from Bing Translator.
Written Opinion of the International Search Authority for PCT/JP2016/053252 dated Apr. 19, 2016 and its English machine translation from Bing Translator.
International Search Report for related PCT/JP2016/053249 dated Apr. 19, 2016 and its English machine translation by Google translate.
International Preliminary Report on Patentability for related PCT/JP2016/053249 completed on Jun. 16, 2016 and its English machine translation by Google translate.
Written Opinion of the International Search Authority for related PCT/JP2016/053249 dated Apr. 19, 2016 and its English machine translation from Bing Translator.

* cited by examiner (a)

(b)

(a)

(b)

(a)

(b)

(a)

(b)

(a)

(b)

(a)

(b)

SEMICONDUCTOR DEVICE AND METHOD FOR MANUFACTURING SEMICONDUCTOR DEVICE

CROSS-REFERENCE TO RELATED APPLICATIONS

The present application is the U.S. national phase of PCT Application PCT/JP2016/053252 filed on Feb. 3, 2016, the disclosure of which is incorporated herein by reference in its entirety.

TECHNICAL FIELD

The present invention relates to a semiconductor device and a method for manufacturing the semiconductor device.

BACKGROUND ART

In the prior art, there is known an electronic element having a chip and the like and a semiconductor module that has a sealing resin that seals this electronic element. An example of the conventional semiconductor module is JP 2011-114176 A. JP 2011-114176 A discloses a power semiconductor device that has a power semiconductor element, a pair of metal members arranged with the power semiconductor element interposed therebetween, a pair of insulating layers laminated on a pair of heat sinks with the pair of metal members interposed therebetween, and a mold resin section charged while covering the power semiconductor element, the pair of metal members, and the pair of insulating layers.

This type of power semiconductor device has a lot of connectors made of metal and the like. In addition, some of connectors are so micro that mounting is unstable. For this reason, mounting connectors in a stable state require a use of a lot of jigs. In addition, although automatic mounting of connectors using a mounter device may be considered, the process takes too much time in case that the number of connectors is large.

SUMMARY OF INVENTION

Problem to be Solved by Invention

The present invention is made in consideration of such regard, and provides a semiconductor device and a method for manufacturing the semiconductor device that enable an easy mounting of a plurality of connectors.

Solution to Problem

A semiconductor device, according to the present invention, comprises:
a first board; and
an intermediate layer being provided on the first board and having a plurality of connectors;
wherein the first board has a positioning section that positions the intermediate layer, and
wherein the intermediate layer is provided with a positioning insertion section, into which the positioning section is inserted.

In the semiconductor device according to the present invention,
the intermediate layer may have a resin board section, in which the plurality of connectors are fixed, and
the resin board section may be provided with the positioning insertion section.

In the semiconductor device according to the present invention,
the intermediate layer may have a first intermediate layer and a second intermediate layer, which is provided on the first intermediate layer,
the first intermediate layer may have a first connector and a first resin board section, in which the first connector is fixed,
the second intermediate layer may have a second connector and a second resin board section, in which the second connector is fixed, and
each of the first resin board section and the second resin board section may be provided with the positioning insertion section, into which the positioning section is inserted.

The semiconductor device, according to the present invention, may further comprises:
a second board being provided on the intermediate layer, and
wherein the second board may be provided with a positioning insertion section, into which the positioning section is inserted.

In the semiconductor device according to the present invention,
the intermediate layer may have a first intermediate layer and a second intermediate layer, which is provided on the first intermediate layer,
the first intermediate layer may have a first connector and a first resin board section, in which the first connector is fixed,
the second intermediate layer may have a second connector and a second resin board section, in which the second connector is fixed, and
the first resin board section or the second resin board section may be provided with the positioning insertion section, into which the positioning section is inserted.

In the semiconductor device according to the present invention,
the first connector may protrudee from the first resin board section to the side on which the second intermediate layer is provided, and
the second resin board section may be provided with a second insertion section, into which the first connector, which protrudes from the first resin board section, is inserted.

In the semiconductor device according to the present invention,
the second connector may protrude from the second resin board section to the side on which the first intermediate layer is provided, and
the first resin board section may be provided with a first insertion section, into which the second connector, which protrudes from the second resin board section, is inserted.

A method for manufacturing a semiconductor device, according to the present invention, comprises:
a step of preparing a first board; and
a step of placing on the first board an intermediate layer having a plurality of connectors;
wherein the first board has a positioning section that positions the intermediate layer, and the intermediate layer is positioned relative to the first board by inserting the positioning section into a positioning insertion section being provided in the intermediate layer.

Advantageous Effects of Invention

According to the present invention, the first board has the positioning section that positions the intermediate layer, and the intermediate layer is provided with the positioning insertion section into which the positioning section is inserted. Thus, the connector can be connected to the first electrically conducting layer or the first electronic element by simply inserting the positioning section into the positioning insertion section, thereby allowing the semiconductor device to be easily produced.

BRIEF DESCRIPTION OF DRAWINGS

FIG. 2(b) is a perspective view of the aspect illustrated in FIG. 2(a).

DESCRIPTION OF EMBODIMENTS

Embodiment

«Structure»

Figure 1:
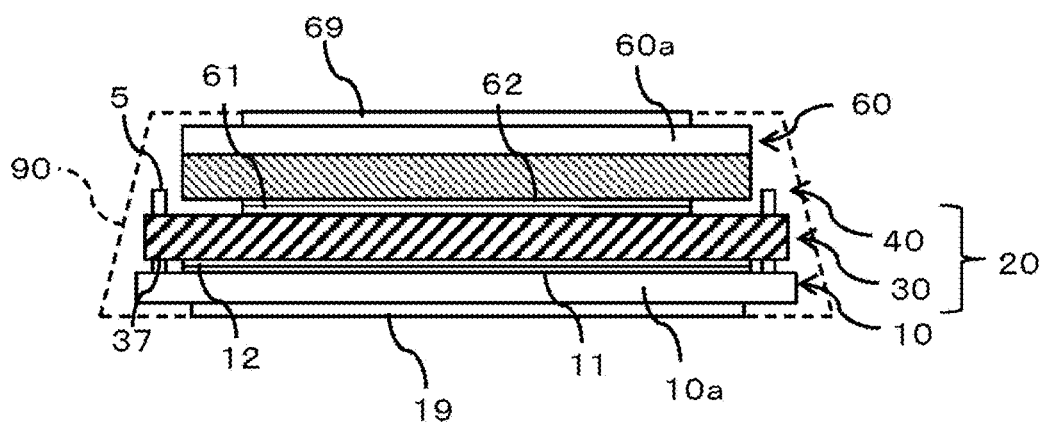
FIG. 1 is a sectional view that illustrates an outline of the structure of a semiconductor device according to an embodiment of the present invention.
Figure 2:
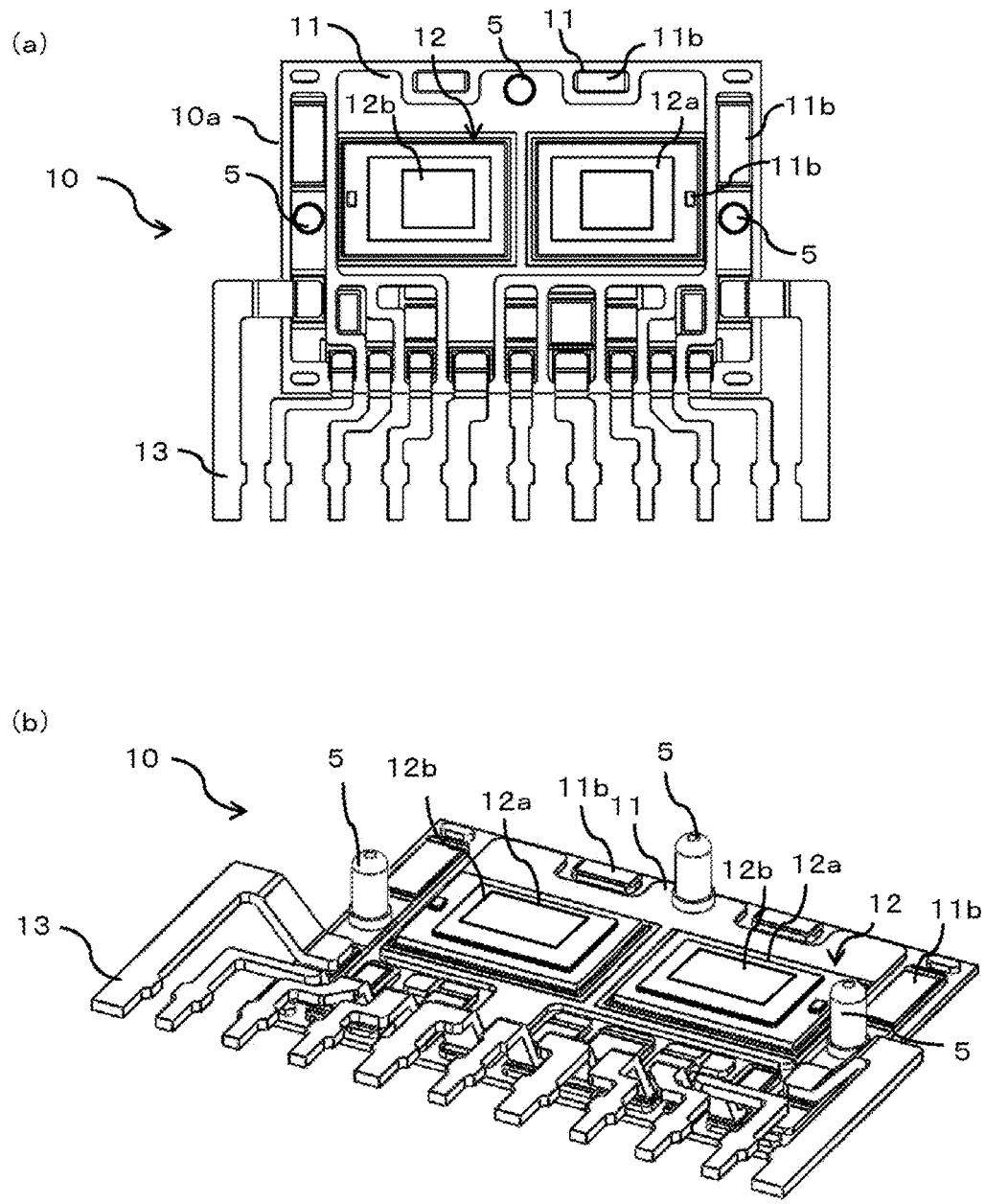
FIG. 2 (a) is a top plan view that illustrates a first board of a semiconductor device according to an embodiment of the present invention.

A semiconductor device of the present embodiment has, as illustrated in FIG. 1, a first board 10 and an intermediate layer 20 that is provided on the first board 10. As illustrated in FIG. 2, the first board 10 has a first board main body 10a, a first electrically conducting layer 11 that is provided on the first board main body 10a, a first electronic element 12 that is provided on the first electrically conducting layer 11, and a connecting terminal 13 that is provided on the first electrically conducting layer 11 and extends along a short direction (a vertical direction of FIG. 2(a)). In the aspect illustrated in FIG. 2, the two first electronic elements 12 are arranged in a line-symmetric manner with respect to a straight line that passes through the center of the semiconductor device along a short direction. The first electronic element 12 is provided with a terminal 12a on its top and bottom surfaces, and a solder 12b is placed on the terminal 12a. As illustrated in FIG. 1, the bottom surface of the first board main body 10a may be provided with a heat dissipation plate 19.

The first board 10 has a positioning section 5 that positions the intermediate layer 20. As illustrated in FIG. 1 and FIGS. 12 to 14, the intermediate layer 20 is provided with positioning insertion sections 37 and 47, into which the positioning section 5 is inserted. While in the present embodiment, a description is made using an aspect in which the intermediate layer 20 has the resin board sections 39 and 49, the present invention is not limited to the above described embodiment, and, for instance, the intermediate layer 20 may have a frame body that has been positioned so that positions of the plurality of connectors 31 and 41 are not misaligned with respect to each other and the frame body may be provided with the positioning insertion sections.

As illustrated in FIG. 1, a semiconductor device of the present embodiment may be provided with a second board 60 on an opposite side (upper side of FIG. 1) to the first board 10 side with respect to the intermediate layer 20. The top surface of a second board main body 60a may be provided with a heat dissipation plate 69.

The intermediate layer 20 has a plurality of connectors 31 and 41 (refer to FIG. 8 and FIG. 9) and resin board sections 39 and 49, in which the plurality of connectors 31 and 41 are fixed. The first connector 31, which is to be described later, is exposed on the first board 10 side from the first resin board section 39, which is to be described later, and is connected with the first electrically conducting layer 11 or the first electronic element 12. In addition, the first connector 31 is exposed also on the second board 60 side from the first resin board section 39, and connected with a second electronic element 62 via a second electrically conducting layer 61.

Figure 12:
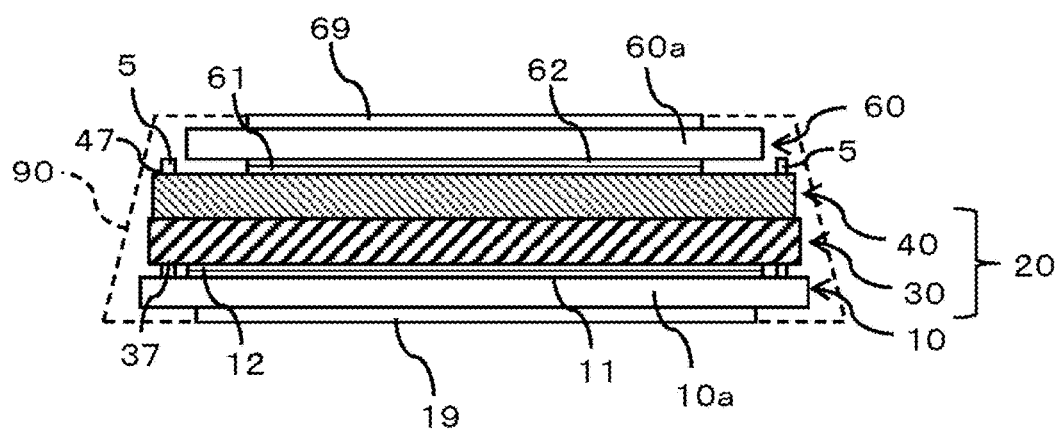
FIG. 12 is a sectional view that illustrates an outline of a structure of a semiconductor device according to a variation 2 of an embodiment of the present invention.

As described later, in case that the intermediate layer 20 has the first intermediate layer 20 and the second intermediate layer 20, as illustrated in FIG. 12, each of the first resin board section 39 and the second resin board section 49 may be provided with the positioning insertion section (the first positioning insertion section) 37 and the positioning insertion section (the second positioning insertion section) 47 into which the positioning section 5 is inserted. In addition, in place of such an aspect, another aspect is acceptable in which, as illustrated in FIG. 1, the first resin board section 39 is provided with the positioning insertion section 37 and the second resin board section 49 is not provided with the positioning insertion section 47.

Figure 13:
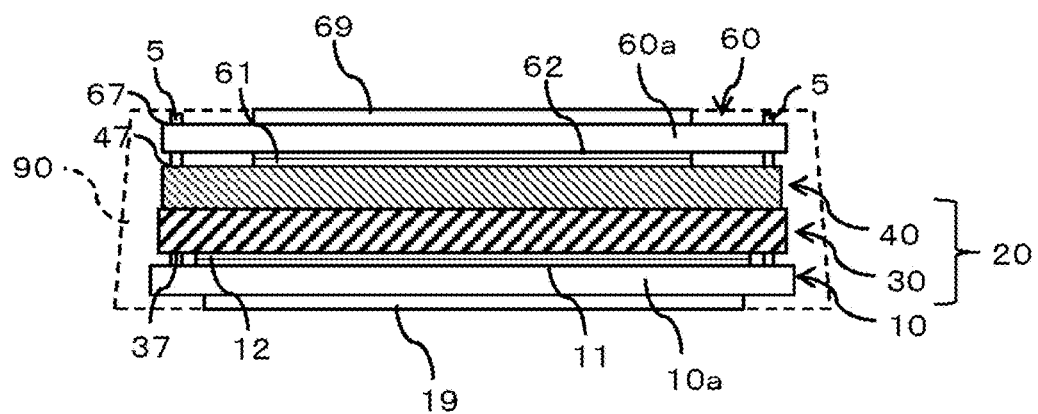
FIG. 13 is a sectional view that illustrates an outline of a structure of a semiconductor device according to a variation 3 of an embodiment of the present invention.
Figure 14:
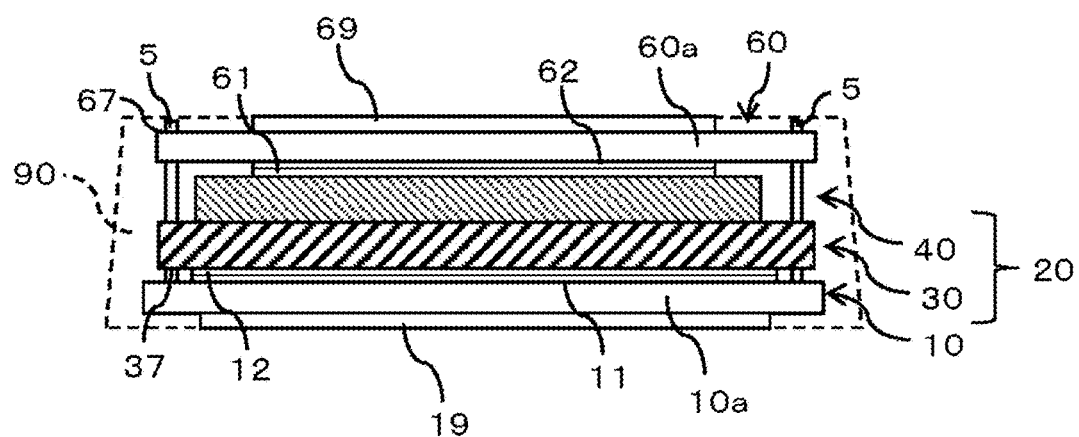
FIG. 14 is a sectional view that illustrates an outline of a structure of a semiconductor device according to a variation 4 of an embodiment of the present invention.

As illustrated in FIG. 13 and FIG. 14, the second board may be provided with a positioning insertion section 67 into which the positioning section 5 is inserted. In case that the intermediate layer 20 has the first intermediate layer 20 and the second intermediate layer 20, as illustrated in FIG. 13, each of the first resin board section 39 and the second resin board section 49 may be provided with the positioning insertion sections 37 and 47 into which the positioning section 5 is inserted, only one of the first resin board section 39 and the second resin board section 49 may be provided with the positioning insertion sections 37 and 47 into which the positioning section 5 is inserted (in an aspect illustrated in FIG. 14, the first resin board section 39 is provided with the positioning insertion sections 37), or the intermediate layer 20 may not be provided with the positioning insertion sections 37 and 47.

In the present embodiment, a description is made below mainly using an aspect, as illustrated in FIG. 1, in which the first resin board section 39 is provided with the positioning insertion section 37 and the second resin board section 49 is not provided with the positioning insertion section 47. More specifically, as illustrated in FIG. 2, the first board 10 has a plurality (three) of the positioning sections 5. While in the plan view the first board main body 10a is in a substantially rectangular shape and the connecting terminal 13 is provided on one side (lower side of FIG. 2(a)) of long sides, each of opposite short sides is provided with the positioning section 5 and another long side on which the connecting terminal 13 is not provided of the long sides is provided with the positioning section 5.

Figure 8:
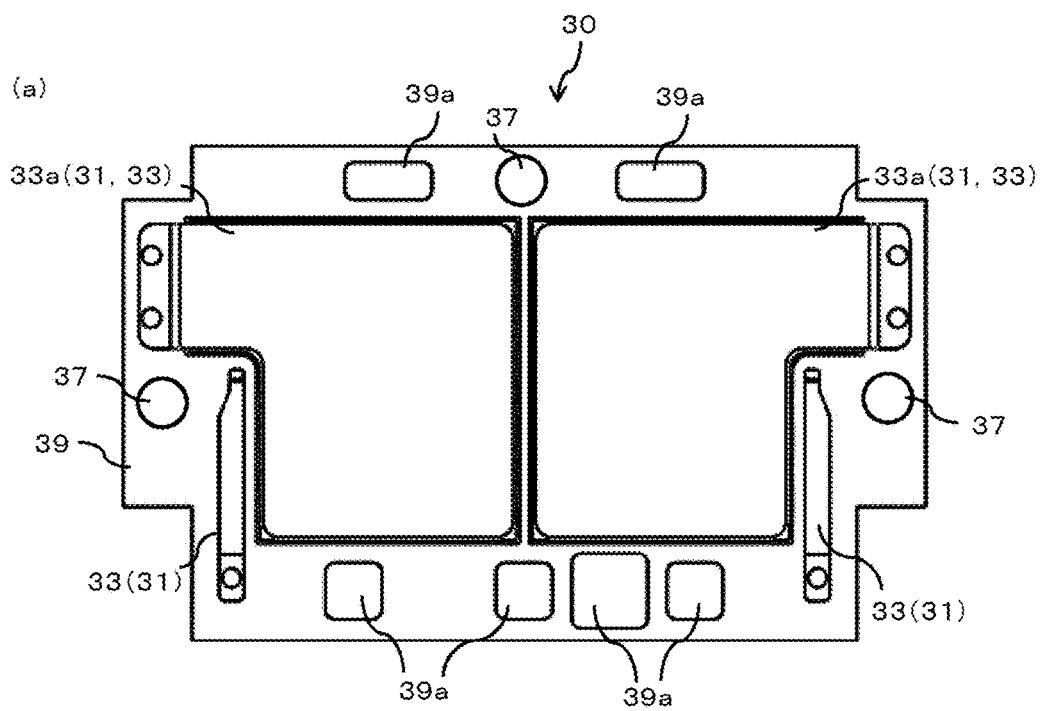
FIG. 8(a) is a top plan view that illustrates a front surface side of a first intermediate layer according to an embodiment of the present invention.
FIG. 8(b) is a perspective view of the first intermediate layer illustrated in FIG. 8(a).
Figure 8:
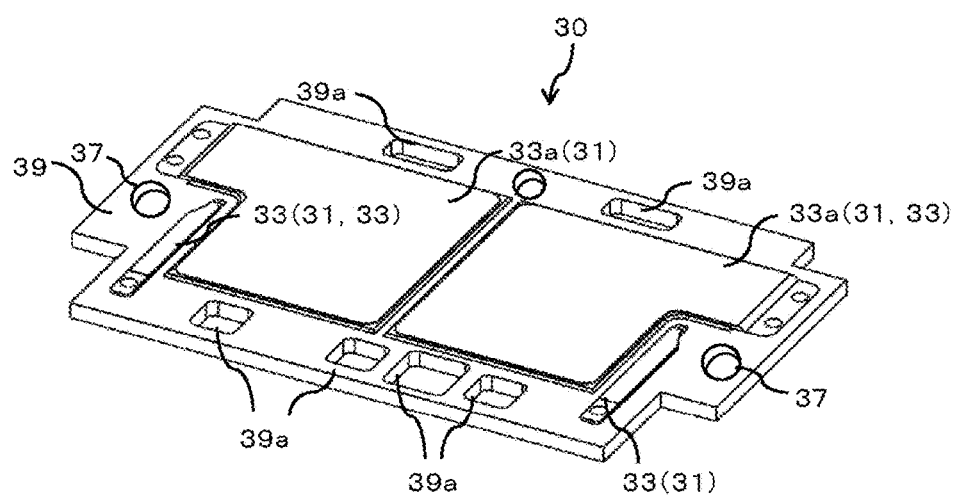
Figure 9:
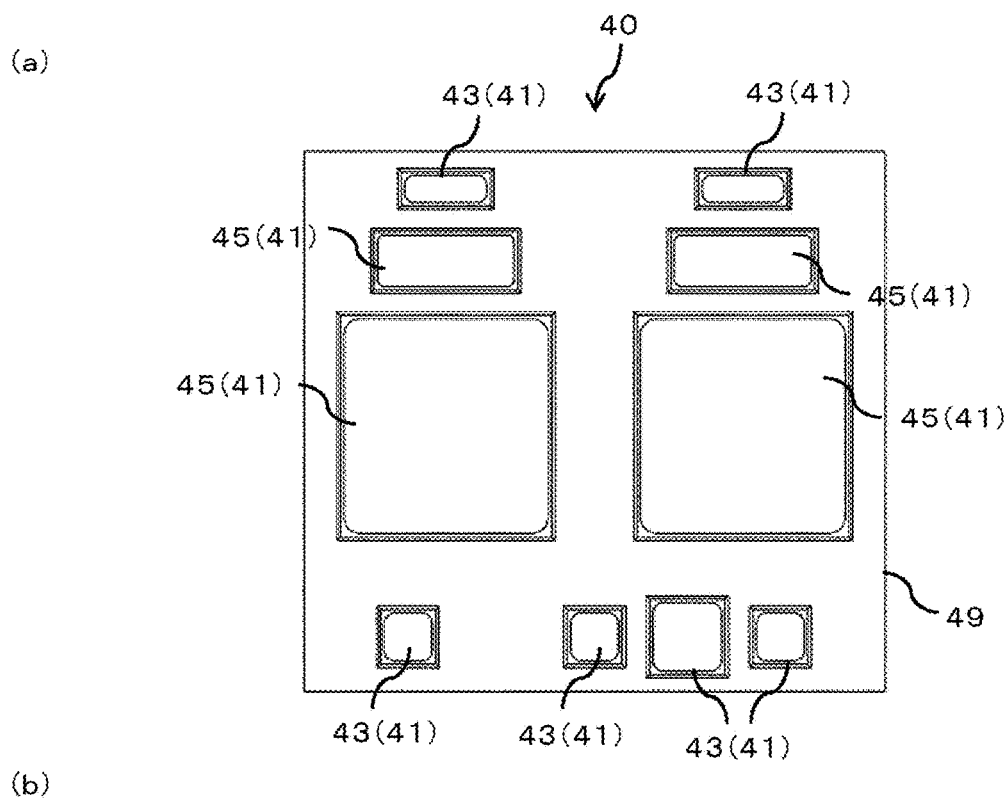
FIG. 9(a) is a top plan view that illustrates a front surface side of a second intermediate layer according to an embodiment of the present invention.
FIG. 9(b) is a perspective view of the second intermediate layer illustrated in FIG. 9(a).
Figure 9:
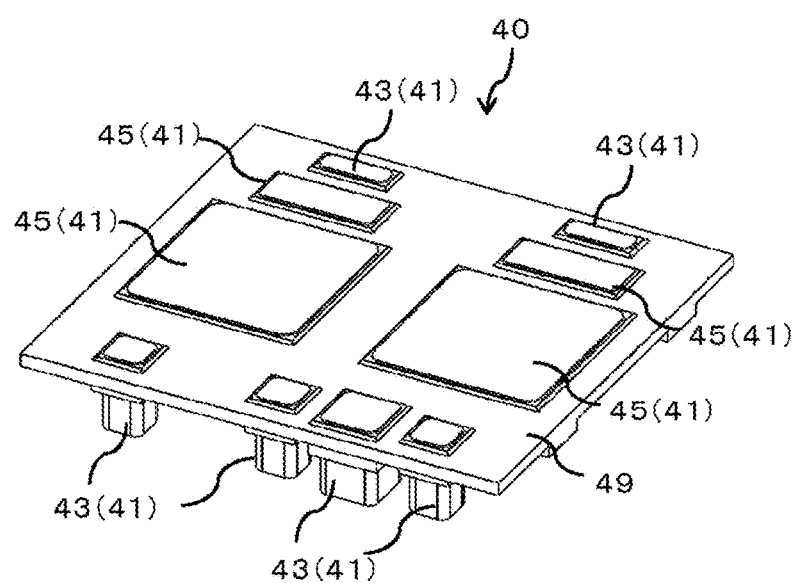

As illustrated in FIG. 1, the intermediate layer 20 may have a first intermediate layer 30 and a second intermediate layer 40, which is provided on the first intermediate layer 30. As illustrated in FIG. 8, the first intermediate layer 30 may have the first connector 31 and the first resin board section 39, in which the first connector 31 is fixed. As illustrated in FIG. 9, the second intermediate layer 40 may have the second connector 41 and the second resin board section 49, in which the second connector 41 is fixed. While in the present embodiment, a description is made using an aspect in which the intermediate layer 20 has the first intermediate layer 30 and the second intermediate layer 40, the present invention is not limited to the above described embodiment, and the intermediate layer 20 may have a single layer (may have a single resin board section) or may have three or more layers (may have three or more resin board sections). In the aspect in which the intermediate layer 20 has the first intermediate layer 30 and the second intermediate layer 40, the connectors 31 and 41 have the first connector 31 and the second connector 41.

As illustrated in FIG. 8, the first resin board section 39 has a plurality (three) of the positioning insertion sections 37. A position of the positioning insertion sections 37 is determined in accordance with a position of the positioning sections 5.

As illustrated in FIG. 9(b), the second connector 41 may protrude from the second resin board section 49 to the side on which the first intermediate layer 30 is provided, and, as illustrated in FIG. 8, the first resin board section 39 may be provided with a first insertion section 39a, into which the second connector 41, which protrudes from the second resin board section 49, is inserted. In place of such an aspect or in combination with such an aspect, the first connector 31 may protrude from the first resin board section 39 to the side on which the second intermediate layer 40 is provided, and the second resin board section 49 may be provided with a second insertion section, into which the first connector 31, which protrudes from the first resin board section 39, is inserted. In the present embodiment, a description is made using an aspect in which the plurality of second connectors 41 (a long, protrusion type second connector 43, to be described later) protrude from the second resin board section 49 to the side on which the first intermediate layer 30 is provided, and are inserted into the first insertion section 39a.

The first connector 31 may protrude from the first resin board section 39 to the first board 10 side or the second intermediate layer 40 side, may penetrate the first resin board section 39, or may be flush with the second resin board section 49 without protruding from the first resin board section 39. That is to say, the plurality of first connectors 31 may have any one or more of a protrusion type first connector 33, a penetration type first connector, and a flush type first connector.

In an aspect illustrated in FIG. 8 as an example, the plurality of first connectors 31 have the protrusion type first connector 33 that protrudes via the first resin board section 39 to the first board 10 side. In the aspect illustrated in FIG. 8, four protrusion type first connectors 33 are provided.

Figure 4:
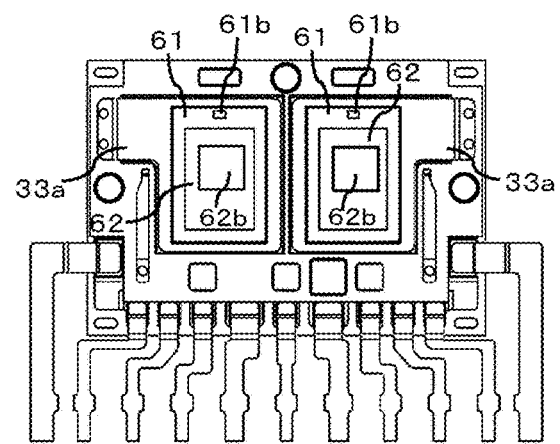
FIG. 4(a) is a top plan view that illustrates a state in which a second electrically conducting layer and a second electronic element are placed on the first intermediate layer that is illustrated in FIG. 3.
FIG. 4(b) is a perspective view of the aspect illustrated in FIG. 4(a).
Figure 4:
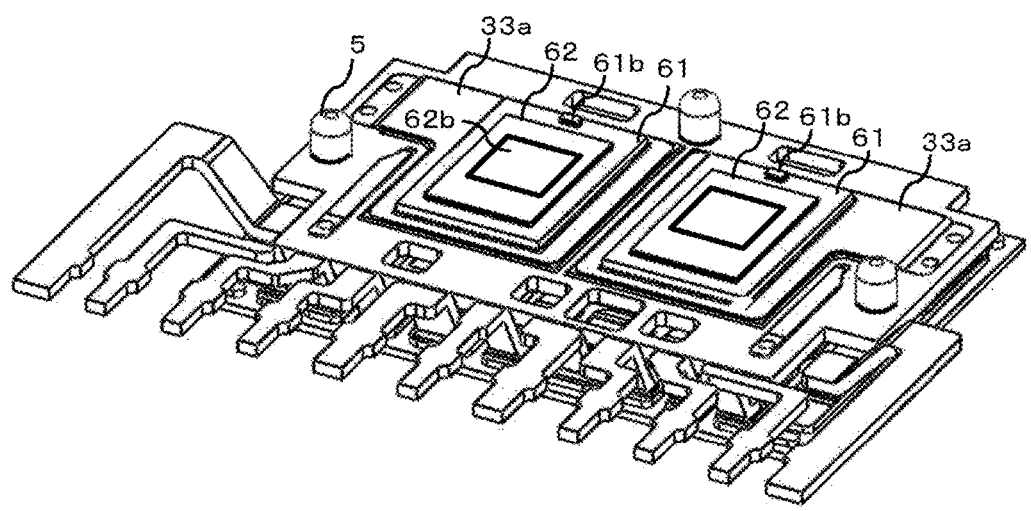

In the aspect illustrated in FIG. 8, the protrusion type first connector 33 has a protrusion type first connector 33a for installation. Then, as illustrated in FIG. 4, a top surface of the protrusion type first connector 33a for installation is made so that the second electronic element 62 is provided thereon. More specifically, the protrusion type first connector 33 has two of the protrusion type first connectors 33a for installation. Then, a top surface of each of the protrusion type first connectors 33a for installation is made so that the second electronic element 62 is provided thereon via the second electrically conducting layer 61.

The second connector 41, which is illustrated in FIG. 9, may protrude from the second resin board section 49 to the first intermediate layer 30 side or the other side of the first intermediate layer 30 side, may penetrate the second resin board section 49, or may be flush with the second resin board section 49 without protruding from the second resin board section 49. That is to say, the plurality of second connectors 41 may have any one or more of the protrusion type second connector 43, a penetration type second connector, and a flush type second connector.

In an aspect illustrated in FIG. 9, as an example, the second connector 41 has the protrusion type second connectors 43 and 45, which protrude from the second resin board section 49 to the first intermediate layer 30 side (back side of the paper surface of FIG. 9(a)). The protrusion type second connectors 43 and 45 have the protrusion type second connector 43, which is inserted into the first insertion section 39a, and the protrusion type second connector 45, which is shorter in length than the protrusion type second connector 43.

In the present embodiment, the protrusion type second connector 43 is made so that it is inserted into the first insertion section 39a of the first resin board section 39 illustrated in FIG. 8. That is to say, each of the six long protrusion type second connectors 43 is made so that it is inserted into the first insertion section 39a.

Although the first resin board section 39 and the second resin board section 49 may be made of the same resin material, the present invention is not limited to the above described embodiment. The first resin board section 39 and the second resin board section 49 may be made of different resin materials.

The first electronic element 12 and the second electronic element 62 of the present embodiment may be power devices. An example of power devices is a switching device. More specifically, examples of power devices have an FET such as a MOSFET, a bipolar transistor, and an IGBT, and typical examples have a MOSFET.

Figure 11:
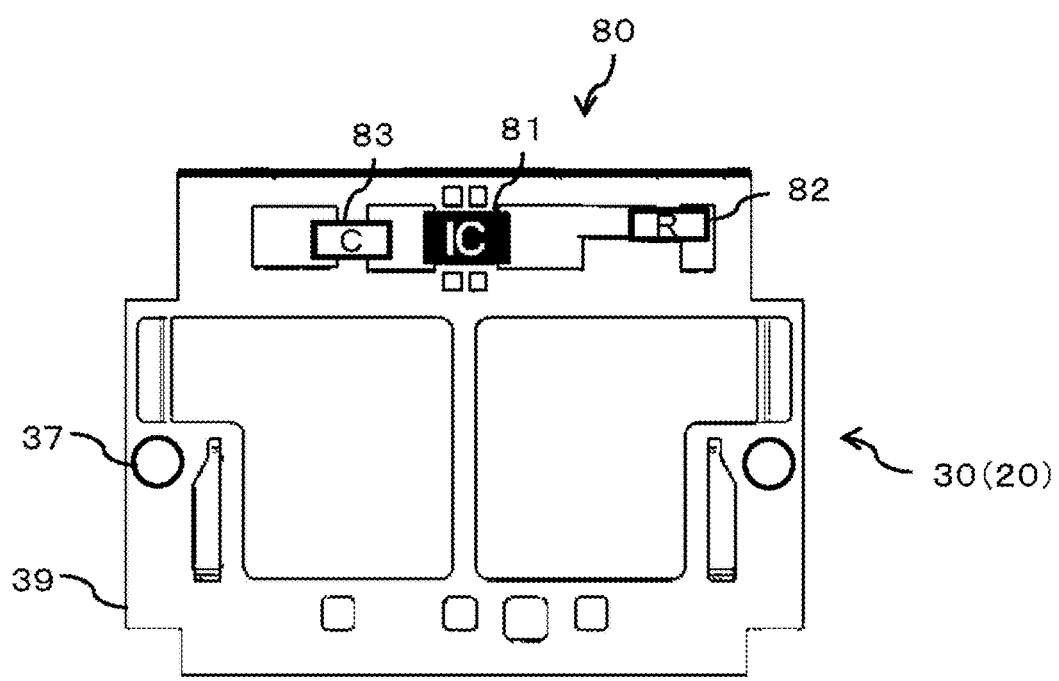
FIG. 11 is a top plan view of a first intermediate layer according to a variation 1 of an embodiment of the present invention.

As illustrated in FIG. 11, the resin board sections 39 and 49 of the intermediate layer 20 may be provided with a control unit 80 that has an IC chip 81, a resistance 82, and a capacitor 83. The control unit 80 may be provided at the first intermediate layer 30, may be provided at the second intermediate layer 40, or may be provided at both the first intermediate layer 30 and the second intermediate layer 40. In an aspect illustrated in FIG. 11, the control unit 80 is provided at the first intermediate layer 30. The control unit 80 may have a function to control the first electronic element 12 and the second electronic element 62 being power devices.

As illustrated in FIG. 1, a semiconductor device of the present embodiment may further have a mold resin section 90 (also refer to FIG. 7) that covers the first board 10, the first intermediate layer 30, the second intermediate layer 40, and the second board 60. The mold resin section 90 and the resin board sections 39 and 49 may be made of different resin materials. If the first resin board section 39 and the second resin board section 49 are made of different resin materials, a resin material of the mold resin section 90 may be different from a resin material of the first resin board section 39 and may be the same as a resin material of the second resin board section 49, or may be different from a resin material of the second resin board section 49 and may be the same as a resin material of the first resin board section 39.

As an example, the mold resin section 90 may be made of a thermosetting resin and the resin board sections 39 and 49 may be made of a thermoplastic resin.

Although a thermoplastic resin is not limited in particular, a plastic or the like may be used. Thermoplastic resins have polyethylene, polypropylene, poly-4-methylpentene-1, ionomer, polystyrene, AS resin, ABS resin, polyvinyl chloride, polyvinylidene chloride, methacrylate resin, polyvinyl alcohol, EVA, polycarbonate, various nylon, various aromatic series or aliphatic polyester, thermoplastic polyurethane, cellulosic plastic, thermoplastic elastomer, polyarylate resin, polyethylene terephthalate, polybutylene terephthalate, polyimide, polyamide imide, polyetherimide, polysulfone, polyether sulfone, polyphenylene sulfide, polyphenyl ether, polybenzimidazole, aramid, and poly(p-phenylene benzobisoxazole).

Thermosetting resins are not limited, and have epoxy resin, phenolic resin, and unsaturated polyester resin, for example.

The connectors 31 and 41 may be different in a surface area of a front surface (surface on the second board 60 side) and a rear surface (surface on the first board 10 side). More specifically, the area of the front surface of the connectors 31 and 41 may be larger than the area of the rear surface thereof.

Figure 10:
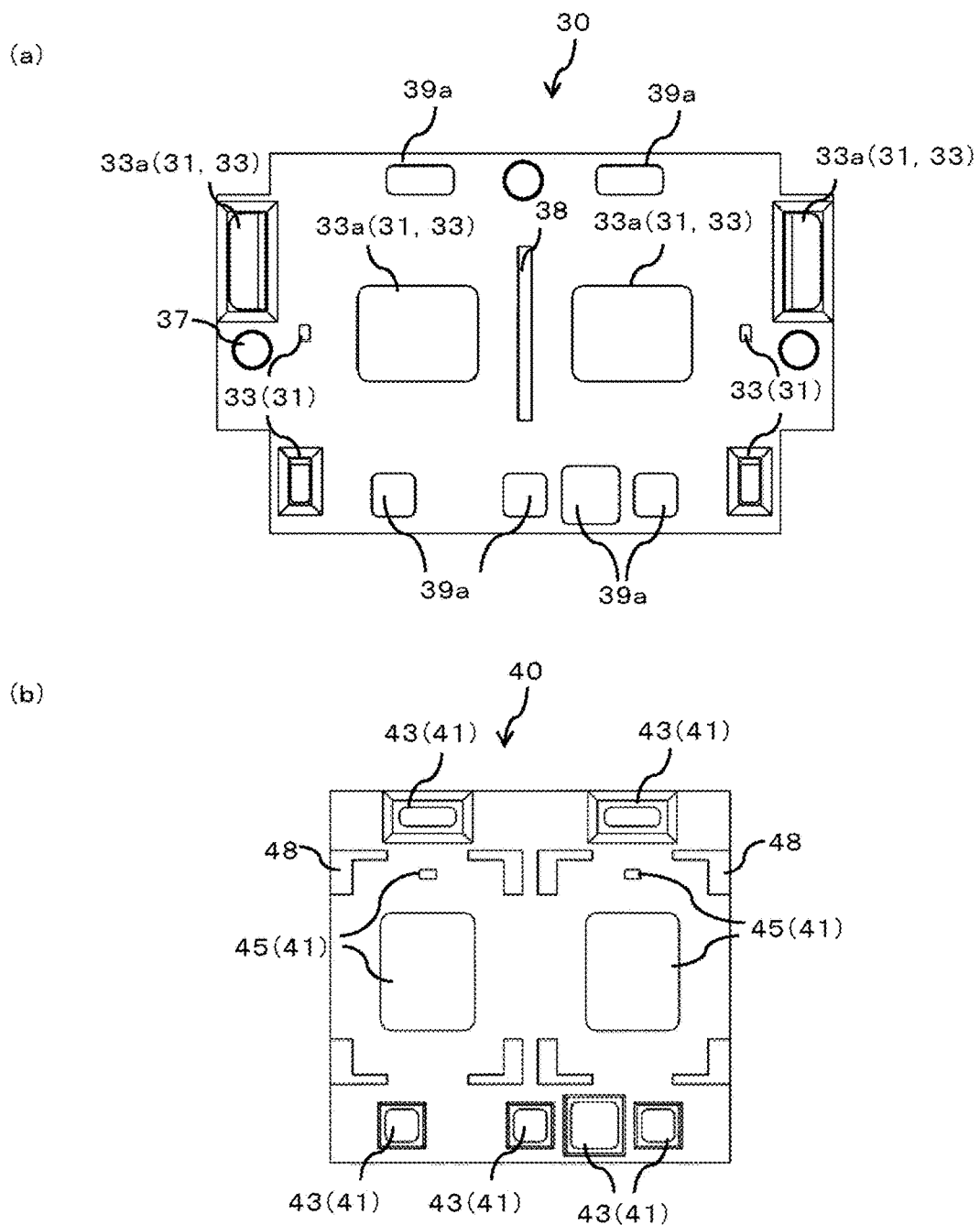
FIG. 10(a) is a bottom plan view that illustrates a rear surface side of a first intermediate layer according to an embodiment of the present invention.
FIG. 10(b) is a bottom plan view that illustrates a rear surface side of a second intermediate layer according to an embodiment of the present invention.

Although it is obvious from the comparison between the drawing of the front side of the first intermediate layer 30 illustrated in FIG. 8(*a*) and the drawing of the rear side of the first intermediate layer 30 illustrated in FIG. 10(*a*), in the present embodiment, as an example, a front surface of the protrusion type first connectors 33*a* for installation (a surface on an opposite side to the first electronic element 12, that is, a top surface) is made larger than a rear surface thereof (a surface on a side of the first electronic element 12, that is, a bottom surface). Due to this, heat generated from the first electronic element 12 can be dissipated using the large front surface of the protrusion type first connectors 33*a* for installation while an area near the first electronic element 12 is reduced as much as possible. It is to be noted that in the present embodiment, since the second electronic element 62 is disposed on the protrusion type first connectors 33*a* for installation via the second electrically conducting layer 61, the second electronic element 62 and the front surface of the protrusion type first connectors 33*a* for installation can be separated from each other at a certain amount of distance. In addition, heat generated from the second electronic element 62 can also be dissipated using the large front surface of the protrusion type first connectors 33*a* for installation.

Although it is obvious from the comparison between the drawing of the front side of the second intermediate layer 40 illustrated in FIG. 9(*a*) and the drawing of the rear side of the first intermediate layer 30 illustrated in FIG. 10(*b*), in the present embodiment, as an example, a front surface of the protrusion type second connector 45 that is short in length (a surface on an opposite side to the second electronic element 62, that is, a top surface) is made larger than a rear surface thereof (a surface on a side of the second electronic element 62, that is, a bottom surface). Due to this, heat generated from the first electronic element 62 can be dissipated using the large front surface of the protrusion type second connector 45 while an area near the second electronic element 62 is reduced as much as possible.

As illustrated in FIG. 10(*a*), a rear surface of the first resin board section 39 (a surface on the first board 10 side) is provided with an integrally molded first protrusion section 38 that protrudes to the first board 10 side on a periphery of the first electronic element 12, and the first protrusion section 38 can prevent an unintended movement of the first electronic element 12. More specifically, the rear surface of the first resin board section 39 is provided with the first protrusion section 38 along a short direction. Although there is a possibility of an unintended movement of the first electronic element 12 before a solder (not illustrated in the drawings) placed between the first electrically conducting layer 11 and the first electronic element 12 is reflowed, such an unintended movement can be prevented in advance by providing the first protrusion section 38.

As illustrated in FIG. 10(*b*), a rear surface of the second resin board section 49 (a surface on the first board 10 side) is provided with an integrally molded second protrusion section 48 that protrudes to the first intermediate layer 30 side on a periphery of the second electronic element 62, and the second protrusion section 48 can prevent an unintended movement of the second electronic element 62. More specifically, the rear surface of the second resin board section 49 is provided with eight L-shaped second protrusion sections 48. Although there is a possibility of an unintended movement of the second electronic element 62 before a solder (not illustrated in the drawings) placed between the second electrically conducting layer 61 and the second electronic element 62 is reflowed, provision of the second protrusion section 48 can prevent such an unintended movement in advance.

«Method for Manufacturing»

An example of a method for manufacturing a semiconductor device of the present embodiment is given below. It is to be noted that all the aspects mentioned in the "Structure" above can be manufactured by the "Method for Manufacturing", although just a simple explanation is given now because otherwise the above description will be given redundantly. In addition, all the aspects described in the "Method for Manufacturing" given below can be applied to the "Structure".

The first board 10 that has the first electrically conducting layer 11 and the first electronic element 12 that is provided on the first electrically conducting layer 11 as illustrated in FIG. 2 is prepared. The solder 12b is placed on the terminal 12a of the first electronic element 12.

The intermediate layer 20 is placed on the first board 10. In case that the intermediate layer 20 has the first intermediate layer 30 and the second intermediate layer 40, the following steps are carried out.

Figure 3:
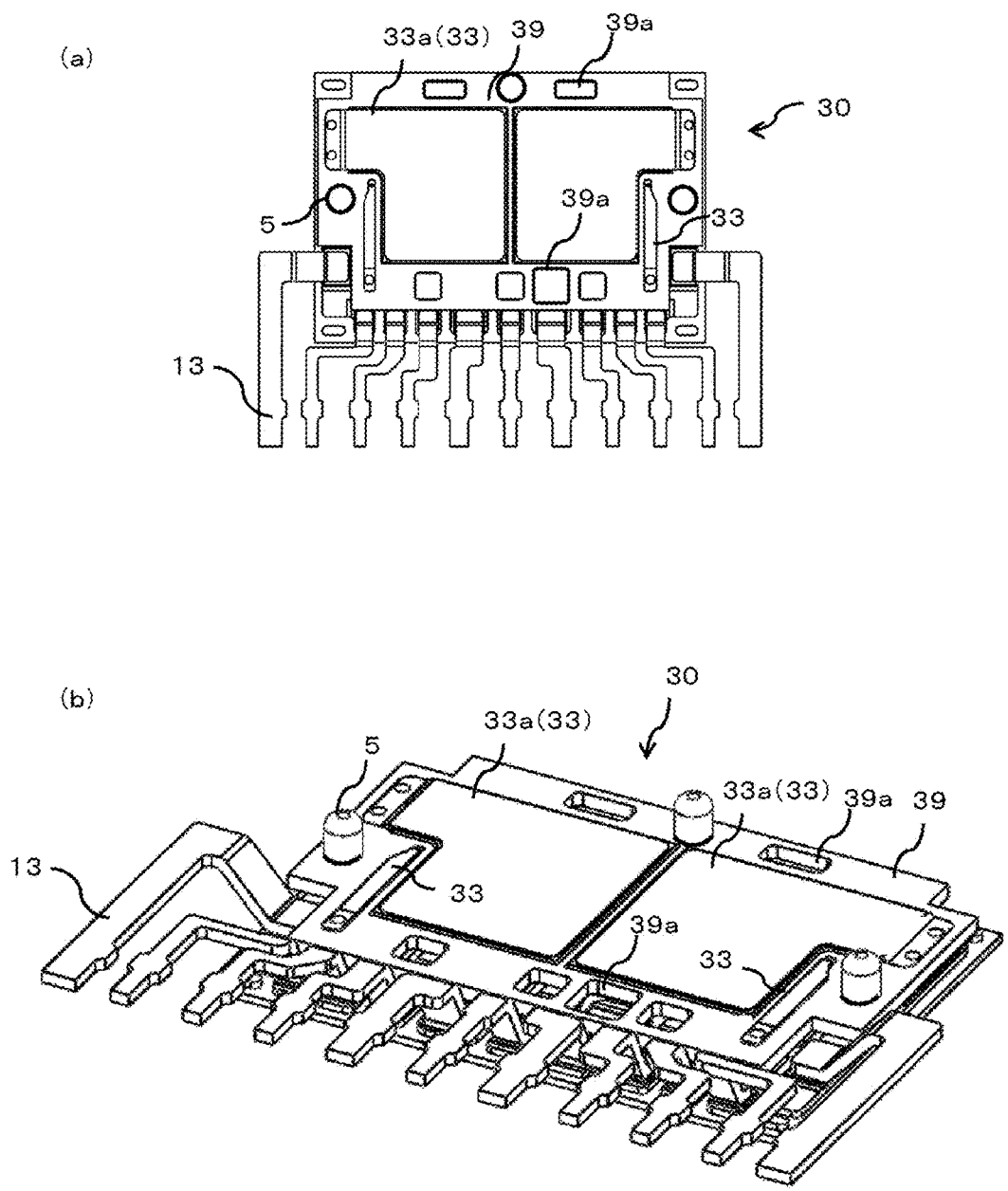
FIG. 3(a) is a top plan view that illustrates a state in which a first intermediate layer is placed on the first board that is illustrated in FIG. 2.
FIG. 3(b) is a perspective view of the aspect illustrated in FIG. 3(a).

By inserting the three positioning sections 5 of the first board 10 into the three positioning insertion sections 37 and 47 of the first intermediate layer 30, the first intermediate layer 30 is placed on the first board 10 (refer to FIG. 3). The first intermediate layer 30 has, as illustrated in FIG. 8, the protrusion type first connector 33 that protrudes from the first resin board section 39 to the first board 10 side. A lower end section of the protrusion type first connector 33 is placed on the solder 12b provided on the terminal 12a of the first electronic element 12 or on a solder 11b (refer to FIG. 2) provided on the first electrically conducting layer 11. More specifically, an inner lower end of the pair of protrusion type first connectors 33a for installation (a lower end that is lowly positioned in the second electronic element 62) is placed on the solder 12b provided on the terminal 12a of the first electronic element 12 and an outer lower end of the two of protrusion type first connectors 33a for installation is placed on the solder 11b provided on the first electrically conducting layer 11 (also refer to FIG. 10 (*a*)). In addition, both lower ends of the protrusion type first connectors 33 that is not the protrusion type first connector 33a for installation are placed on the solder 11b provided on the first electrically conducting layer 11 (also refer to FIG. 10 (*a*)).

Next, as illustrated in FIG. 4, the second electronic element 62 is provided on the top surface of the protrusion type first connector 33a for installation via the second electrically conducting layer 61. A solder 62b is provided on a top surface of the second electronic element 62 and a solder 61b is provided on a top surface of the second electrically conducting layer 61.

It is to be noted that as mentioned previously, the first intermediate layer 30 may be placed on the first board 10 after the second electronic element 62 is provided on the first intermediate layer 30 in place of adopting an aspect in which the second electronic element 62 is provided on the first intermediate layer 30 after the first intermediate layer 30 is placed on the first board 10. According to such an aspect, it is advantageous in that the second electronic element 62 can be provided on the first intermediate layer 30 in a more stable state.

Figure 5:
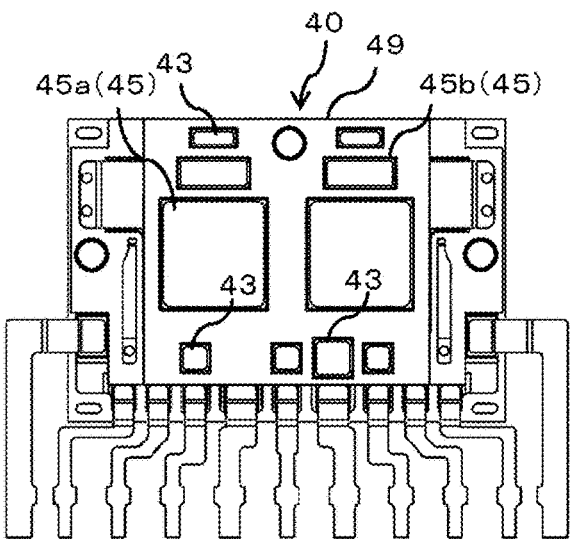
FIG. 5(a) is a top plan view that illustrates a state in which a second intermediate layer is placed on the first intermediate layer, the second electrically conducting layer, and the second electronic element that are illustrated in FIG. 4.
FIG. 5(b) is a perspective view of the aspect illustrated in FIG. 5(a).
Figure 5:
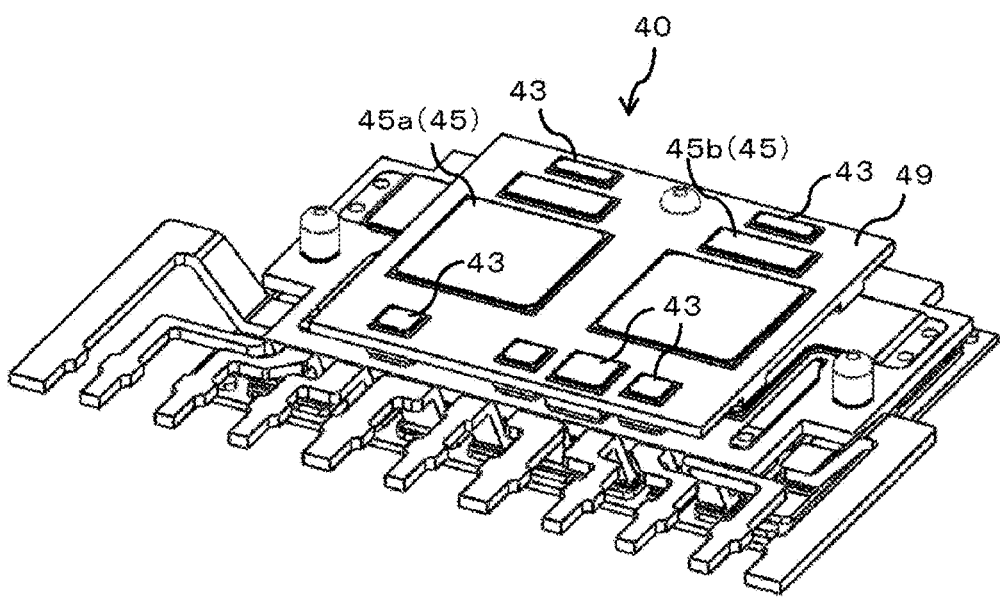

As mentioned previously, when the first intermediate layer 30 on which the second electronic element 62 is provided is placed on the first board 10, the second intermediate layer 40 is placed on the first intermediate layer 30 as illustrated in FIG. 5. The first resin board section 39 of the first intermediate layer 30 is provided with a first insertion section 39a into which the protrusion type second connector 43 is inserted. As a result, when the second intermediate layer 40 is placed on the first intermediate layer 30, each of the six protrusion type second connectors 43 is inserted into the first insertion section 39a. In this way, by placing the second intermediate layer 40 on the first intermediate layer 30, apart of a lower end of the protrusion type second connector 45 of the second intermediate layer 40 is placed on the solder 62b of the top surface of the second electronic element 62 and the remaining part is placed on the solder 61b of the top surface of the second electrically conducting layer 61. More specifically, the lower end of a protrusion type second connector 45a with a large cross-sectional area is placed on the solder 62b of the top surface of the second electronic element 62 and the lower end of a protrusion type second connector 45b with a small cross-sectional area is placed on the solder 61b of the top surface of the second electrically conducting layer 61 (also refer to FIG. 10(*b*)).

Figure 6:
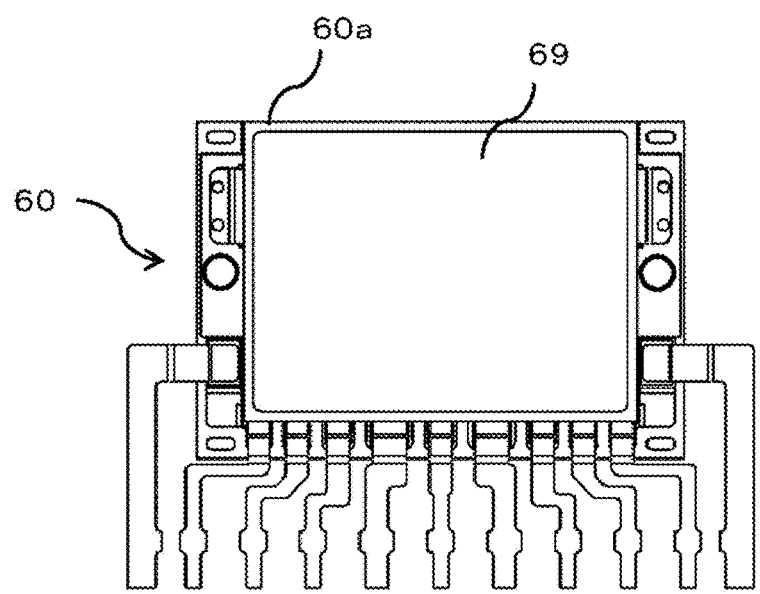
FIG. 6(a) is a top plan view that illustrates a state in which the second board is placed on the second intermediate layer that is illustrated in FIG. 5.
FIG. 6(b) is a perspective view of the aspect illustrated in FIG. 6(a).
Figure 6:
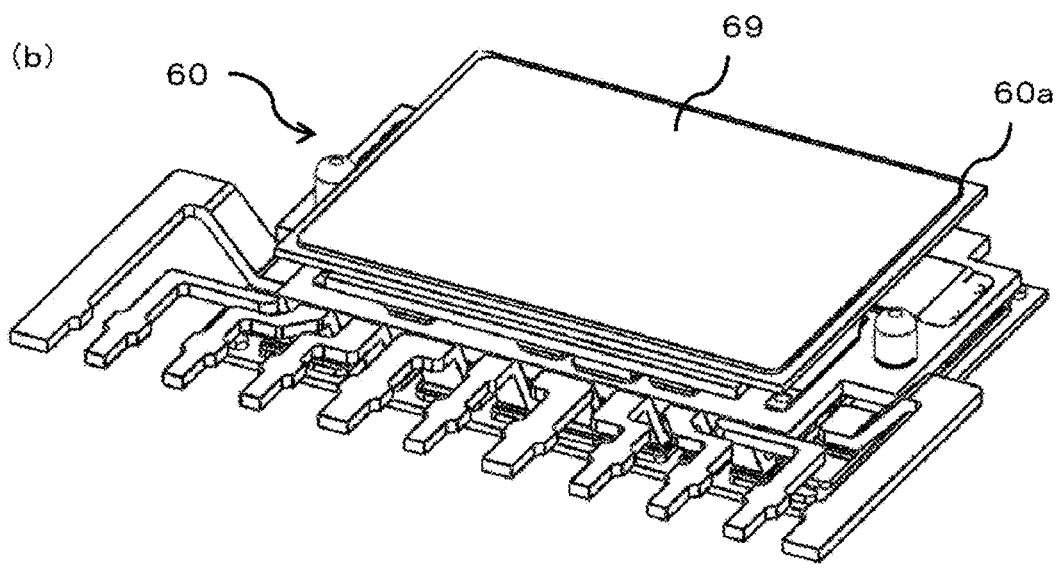

Next, as illustrated in FIG. 6, the second board 60 is placed on the top surface of the second intermediate layer 40.

Figure 7:
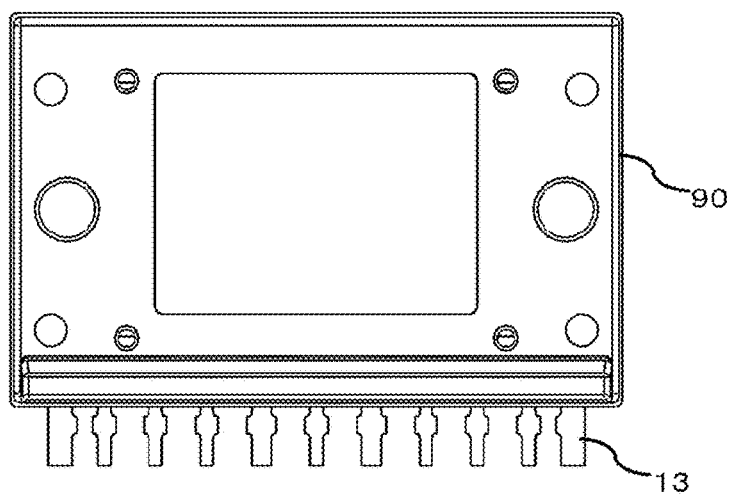
FIG. 7(a) is a top plan view that illustrates a state in which the first board, the first intermediate layer, the second intermediate layer, and the second board that are illustrated in FIG. 6 are sealed with resin.
FIG. 7(b) is a perspective view of the aspect illustrated in FIG. 7(a).
Figure 7:
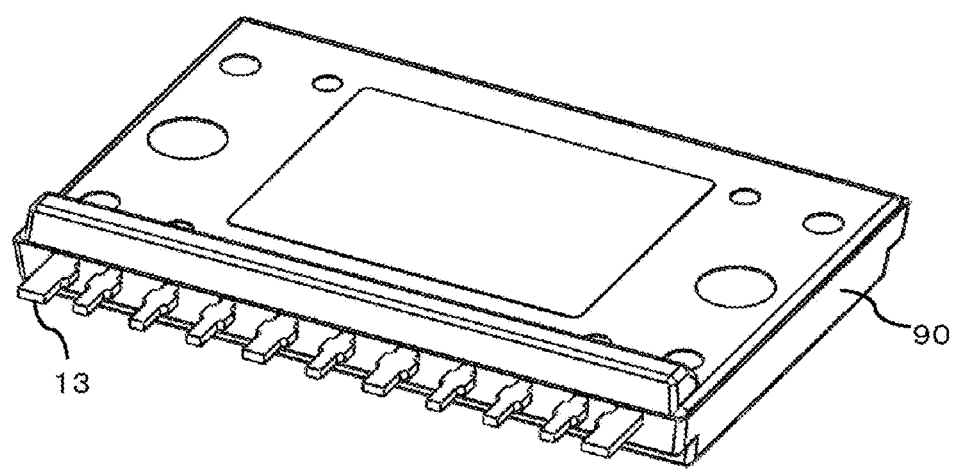

After that, as illustrated in FIG. 7, an integral matter of the first board 10, the first intermediate layer 30, the second intermediate layer 40, and the second board 60 is heated at a temperature of 240° C. to 260° C. so that the solder is reflowed. After that, the integral matter is put into a mold and a sealing material that is a material of a mold resin section 90 is poured into the mold. As a result, a semiconductor device is manufactured.

«Operational Advantages»

Explanations that have not been made regarding advantageous effects of the present embodiment having the structure mentioned above will be made next.

According to the present embodiment, the first board 10 has the positioning section 5 that positions the intermediate layer 20, and the intermediate layer 20 is provided with the positioning insertion sections 37 and 47 into which the positioning section 5 is inserted. Thus, the connectors 31 and 41 can be connected to the first electrically conducting layer 11 or the first electronic element 12 by simply inserting the positioning section 5 into the positioning insertion sections 37 and 47, thereby allowing the semiconductor device to be easily produced.

In the present embodiment, in case that an aspect in which the intermediate layer 20 has the resin board sections 39 and 49 is adopted, the plurality of connectors 31 and 41 are positioned in advance and the positioning insertion sections 37 and 47 can be formed in advance. Due to this, the connectors 31 and 41 and the first electrically conducting layer 11 can be connected by simply placing on the first board 10 the connectors 31 and 41 that have already been positioned by the resin board sections 39 and 49, thereby allowing the semiconductor device to be easily produced.

It is to be noted that although a jig is necessary when the plurality of connectors 31 and 41 are provided on the intermediate layer 20, a work using the jig will not be complicated because the structure is simple.

In the present embodiment, it is advantageous in that the second electronic element 62 can be laminated on the first electronic element 12 in case that an aspect is adopted in which the connector (the first connector 31) is exposed from the resin board section (the first resin board section 39) on the second board 60 side and is connected with the second electronic element 62 (refer to FIG. 9).

In the present embodiment, it is advantageous in that a position of each of the first intermediate layer 30 and the second intermediate layer 40 with respect to the first board 10 can be easily determined by the positioning section 5 incase that an aspect is adopted in which each of the first resin board section 39 of the first intermediate layer 30 and the second resin board section 49 of the second intermediate layer 40 is provided with the positioning insertion sections 37 and 47 into which the positioning section 5 is inserted.

It is advantageous in that a position of the second board 60 with respect to the first board 10 can be easily determined by the positioning section 5 in case that an aspect in which the second board 60 is provided with the positioning insertion section 67 is adopted.

It is advantageous in that a position of the first intermediate layer 30 or the second intermediate layer 40 that is provided with the positioning insertion sections 37 and 47 with respect to the first board 10 can be easily determined by the positioning section 5 in case that an aspect is adopted in which one of the first resin board section 39 of the first intermediate layer 30 and the second resin board section 49 of the second intermediate layer 40 is provided with the positioning insertion sections 37 and 47 into which the positioning section 5 is inserted.

In the present embodiment, it is advantageous in that the connectors 31 and 41 can be positioned in advance with respect to the resin board sections 39 and 49 on each of the first intermediate layer 30 and the second intermediate layer 40 in case that an aspect is adopted in which the intermediate layer has the first intermediate layer 30 and the second intermediate layer 40, the first intermediate layer 30 has the first resin board section 39 in which the first connector 31 is fixed, and the second intermediate layer 40 has the second resin board section 49 in which the second connector 41 is fixed (refer to FIG. 8 and FIG. 9).

In the present embodiment, it is advantageous in that a relative positioning between the first intermediate layer 30 and the second intermediate layer 40 can be carried out by simply inserting into a second insertion section the first connector 31 that protrudes from the first resin board section 39 in case that an aspect is adopted in which the first connector 31 protrudes from the first resin board section 39 to a side on which the second intermediate layer 40 is provided and the second resin board section 49 is provided with the second insertion section into which the first connector 31 that protrudes from the first resin board section 39 is inserted.

On the other hand, it is advantageous in that a relative positioning between the first intermediate layer 30 and the second intermediate layer 40 can be carried out by simply inserting into the first insertion section 39a the second connector 41 (the protrusion type second connector 43) that protrudes from the second resin board section 49 also in case that an aspect is adopted in which the second connector 41 protrudes from the second resin board section 49 to a side on which the first intermediate layer 30 is provided and the first resin board section 39 is provided with the first insertion section 39a into which the second connector 41 (the protrusion type second connector 43) that protrudes from the second resin board section 49 is inserted (refer to FIG. 8 and FIG. 9).

In the present embodiment, in case that the protrusion type first connector 33 that protrudes to the first board 10 side is adopted (refer to FIG. 8), a space between the first board 10 and the first intermediate layer 30 can become thicker, which is advantageous in case that there is a need for making the space thicker in terms of an arrangement of the first electronic element 12 and the like. In addition, in case that the protrusion type first connector 33 that protrudes to the first board 10 side is adopted, it is advantageous also in that a good solder fillet can be formed in a periphery of the protrusion type first connector 33. It is advantageous in that a positioning function is provided in case that an aspect is adopted in which the protrusion type first connector that protrudes to the second intermediate layer 40 side is adopted and is inserted into the second insertion section of the second intermediate layer 40. It is advantageous in that functions of both the protrusion type first connector 33 that protrudes to the first board 10 side and the protrusion type first connector that protrudes to the second intermediate layer 40 side can be provided in case that a penetration type first connector is adopted. It is advantageous in that a thickness in a thickness direction can be reduced in case that a flush type first connector is adopted.

In addition, the first intermediate layer 30 can be placed on the first board 10 in a stable aspect in case that an aspect is adopted in which a plurality of lower ends of the protrusion type first connector (the protrusion type first connector 33 in FIG. 8) that protrudes to the first board 10 side are provided.

In the present embodiment, in case that the protrusion type second connector that protrudes to the second board 60 side is adopted, a space between the second board 60 and the second intermediate layer 40 can become thicker, which is advantageous in case that there is a need for making the space thicker in terms of an arrangement of the second electronic element 62 and the like. It is advantageous in that the (long) protrusion type second connector 43 can be inserted into the first insertion section 39a of the first intermediate layer 30 and a positioning function can be provided, in case that an aspect is adopted in which the protrusion type second connector 43 that protrudes to the first intermediate layer 30 side is adopted and the first insertion section 39a is provided on the first intermediate layer 30. In addition, it is advantageous in that the (short) protrusion type second connector 45 can be easily connected to the second electrically conducting layer 61 and the second electronic element 62 in case that the protrusion type second connector 45 that protrudes to the first intermediate layer 30 side is adopted. It is advantageous in that functions of both the protrusion type second connector that protrudes to the second board 60 side and the protrusion type second connector 43 that protrudes to the first intermediate layer 30 side can be provided in case that a penetration type second connector is adopted. It is advantageous in that a thickness in a thickness direction can be reduced in case that a flush type second connector is adopted.

It is advantageous because the first resin board section 39 and the second resin board section 49 can be provided with different functions in case that an aspect in which the first resin board section 39 and the second resin board section 49 are formed of different resin materials is adopted. As an example, in case that a thickness of the second resin board section 49 is thinner than a thickness of the first resin board section 39, a resin whose strength is higher than that of a material of the first resin board section 39 may be used as a material of the second resin board section 49. In this case, PEEK (polyether ether ketone) may be used as a material of the second resin board section 49 and PPS (polyphenylene sulfide) or PBT (polybutylene terephthalate) may be used as a material of the first resin board section 39. According to such an aspect, it is advantageous in that a high strength can be achieved even in the thin second resin board section 49 and a similar strength can be achieved in the first resin board section 39 and the second resin board section 49.

As illustrated in FIG. 11, in case that an aspect in which the resin board sections 39 and 49 of the intermediate layer are provided with the control unit 80 is adopted, a possibility of malfunction can be reduced in advance because a power section and the control unit 80 can be positioned very close to each other. In addition, providing the control unit 80 in a semiconductor device realizes an IPM (Intelligent Power Module).

It is advantageous in that the resin board sections 39 and 49 that are positioned in an inner side and the mold resin section 90 that is positioned in an outer side can carry out different functions in case that an aspect in which the mold resin section 90 and the resin board sections 39 and 49 are formed of different resin materials is adopted. For example, even in case that the mold resin section 90 is a thermosetting resin, a high positioning accuracy is expected in case that a thermoplastic resin is adopted as a material of the resin board sections 39 and 49. That is to say, there is a possibility that a position of the connectors 31 and 41 is misaligned from a planned position because a hardness is not sufficient before heat is applied, in case that a thermosetting resin is used as a material of the resin board sections 39 and 49. In this regard, the possibility that a position of the connectors 31 and 41 is misaligned from a planned position can be reduced because a hardness is sufficient before heat is applied, in case that a thermoplastic resin is used as a material of the resin board sections 39 and 49. It is to be noted that, explaining using an aspect of the present embodiment, adopting a thermoplastic resin as the first resin board section 39 can more securely prevent the first insertion section 39a from changing in shape or misaligning and adopting a thermoplastic resin as the second resin board section 49 can more securely prevent a position of the protrusion type second connector 43 from misaligning.

Lastly, descriptions on the aforementioned respective embodiments and variations as well as disclosed drawings are merely examples for describing the invention described in CLAIMS. The descriptions on the aforementioned embodiments or disclosed drawings should not be construed to limit the invention described in CLAIMS.

REFERENCE SIGNS LIST

5 POSITIONING SECTION
10 FIRST BOARD
11 FIRST ELECTRICALLY CONDUCTING LAYER
12 FIRST ELECTRONIC ELEMENT
20 INTERMEDIATE LAYER
30 FIRST INTERMEDIATE LAYER
31 FIRST CONNECTOR
37 POSITIONING INSERTION SECTION
39 FIRST RESIN BOARD SECTION
39a FIRST INSERTION SECTION
40 SECOND INTERMEDIATE LAYER
41 SECOND CONNECTOR
47 POSITIONING INSERTION SECTION
49 SECOND RESIN BOARD SECTION
60 SECOND BOARD
61 SECOND ELECTRICALLY CONDUCTING LAYER

What is claimed is:

1. A semiconductor device comprising:
a first board; and
an intermediate layer being provided on the first board and having a plurality of connectors, which are not solders, and a resin board section, in which the plurality of connectors are fixed;
wherein the connector passes through the resin board section, and a front face of the connector and a rear face of the connector are respectively exposed from the resin board section,
wherein the first board has a positioning section that positions the intermediate layer,
wherein the resin board section of the intermediate layer is provided with a positioning insertion section, into which the positioning section is inserted,
wherein an electronic element being a power device is provided on the front face of the connector or the rear face of the connector
wherein an area of the connector in a top plan view is larger than an area of the electronic element in the top plan view, and
wherein a control unit configured to control the electronic element is provided at the resin board section of the intermediate layer and is not provided on the connector.

2. The semiconductor device according to claim 1,
wherein the intermediate layer has a first intermediate layer and a second intermediate layer, which is provided on the first intermediate layer,
wherein the first intermediate layer has a first connector and a first resin board section, in which the first connector is fixed,
wherein the second intermediate layer has a second connector and a second resin board section, in which the second connector is fixed, and
wherein each of the first resin board section and the second resin board section is provided with the positioning insertion section, into which the positioning section is inserted.

3. The semiconductor device, according to claim 1, further comprising:
a second board being provided on the intermediate layer, and
wherein the second board is provided with a positioning insertion section, into which the positioning section is inserted.

4. The semiconductor device according to claim 1,
wherein the intermediate layer has a first intermediate layer and a second intermediate layer, which is provided on the first intermediate layer,
wherein the first intermediate layer has a first connector and a first resin board section, in which the first connector is fixed,
wherein the second intermediate layer has a second connector and a second resin board section, in which the second connector is fixed, and
wherein the first resin board section or the second resin board section is provided with the positioning insertion section, into which the positioning section is inserted.

5. The semiconductor device according to claim 4,
wherein the first connector protrudes from the first resin board section to the side on which the second intermediate layer is provided, and
wherein the second resin board section is provided with a second insertion section, into which the first connector, which protrudes from the first resin board section, is inserted.

6. The semiconductor device according to claim 4,
wherein the second connector protrudes from the second resin board section to the side on which the first intermediate layer is provided, and
wherein the first resin board section is provided with a first insertion section, into which the second connector, which protrudes from the second resin board section, is inserted.

7. A method for manufacturing a semiconductor device comprising:
a step of preparing a first board;
a step of placing on the first board an intermediate layer having a plurality of connectors, which are not solders, and a resin board section, in which the plurality of connectors are fixed; and a step of placing an electronic element being a power device on the connector, whose area in a top plan view is larger than an area of the electronic element in the top plan view, of the intermediate layer, wherein the first board has a positioning section that positions the intermediate layer, and the intermediate layer is positioned relative to the first board by inserting the positioning section into a positioning insertion section being provided at the resin board section of the intermediate layer, and wherein a control unit configured to control the electronic element is provided at the resin board section of the intermediate layer and is not provided on the connector, and wherein the connector passes through the resin board section, and a front face of the connector and a rear face of the connector are respectively exposed from the resin board section.

\* \* \* \* \*